United States Patent
Skrovan et al.

[11] Patent Number: 6,016,554
[45] Date of Patent: Jan. 18, 2000

[54] METHOD FOR EVENT-RELATED FUNCTIONAL TESTING OF A MICROPROCESSOR

[75] Inventors: Joseph C. Skrovan, Buda; Allan Parker, Austin, both of Tex.

[73] Assignee: Advanced Micro Devices, Inc., Sunnyvale, Calif.

[21] Appl. No.: 08/901,576

[22] Filed: Jul. 28, 1997

[51] Int. Cl.[7] .................................................. G06F 11/00
[52] U.S. Cl. ............................................................ 714/25
[58] Field of Search ........................ 395/183.01, 183.04, 395/183.1, 183.13, 183.14, 183.15, 182.06, 182.21, 185.08, 500; 371/22.31, 25.1; 364/576, 232.3, 232.8; 714/720

[56] References Cited

U.S. PATENT DOCUMENTS

| | | | |
|---|---|---|---|
| 4,455,654 | 6/1984 | Bhaskar et al. | 395/183.04 |
| 4,998,250 | 3/1991 | Kohlmeier et al. | 714/27 |
| 5,263,149 | 11/1993 | Winlow | 364/578 |
| 5,321,828 | 6/1994 | Phillips et al. | 395/500.49 |
| 5,345,583 | 9/1994 | Davis | 395/185.08 |
| 5,465,216 | 11/1995 | Rotem et al. | 364/488 |
| 5,696,701 | 12/1997 | Burgess et al. | 714/26 |
| 5,740,183 | 4/1998 | Lowe | 395/183.01 |
| 5,742,502 | 4/1998 | Cherichetti et al. | 395/881 |
| 5,812,561 | 9/1998 | Giles et al. | 371/22.31 |

*Primary Examiner*—Robert W. Beausoliel, Jr.
*Assistant Examiner*—Pierre E. Elisca
*Attorney, Agent, or Firm*—Kevin L. Daffer; Conley, Rose & Tayon

[57] ABSTRACT

A method is presented for event-related functional testing of a microprocessor. A model of the microprocessor is adapted to produce a trigger event, perform a target activity, and respond to a control signal. The target activity occurs over several system clock signal cycles. A control signal generator receives the trigger event and generates the control signal a selectable number of clock cycles (i.e., a delay time) after the trigger event. A testing program includes a program loop which causes the microprocessor model to produce the trigger event, perform the target activity to produce a test result, and compare the test result to an expected result. The program loop is repeatedly executed until the microprocessor model responds to the control signal during each clock cycle of the target activity. If the test result matches the expected result during each execution of the program loop, the microprocessor properly responds to the control signal during the target activity. The microprocessor model may be a software or hardware implementation. Software embodiments of a bus model, a memory model, and a test engine provide an operating environment for the microprocessor model. A microprocessor testing system includes a central processing unit (CPU), chip set logic, a system bus, a memory bus, and a memory unit. In a first embodiment of the testing system, the microprocessor model, the bus model, the memory model, and the test engine reside within the memory unit. In a second embodiment, the microprocessor model is a separate hardware implementation.

31 Claims, 8 Drawing Sheets

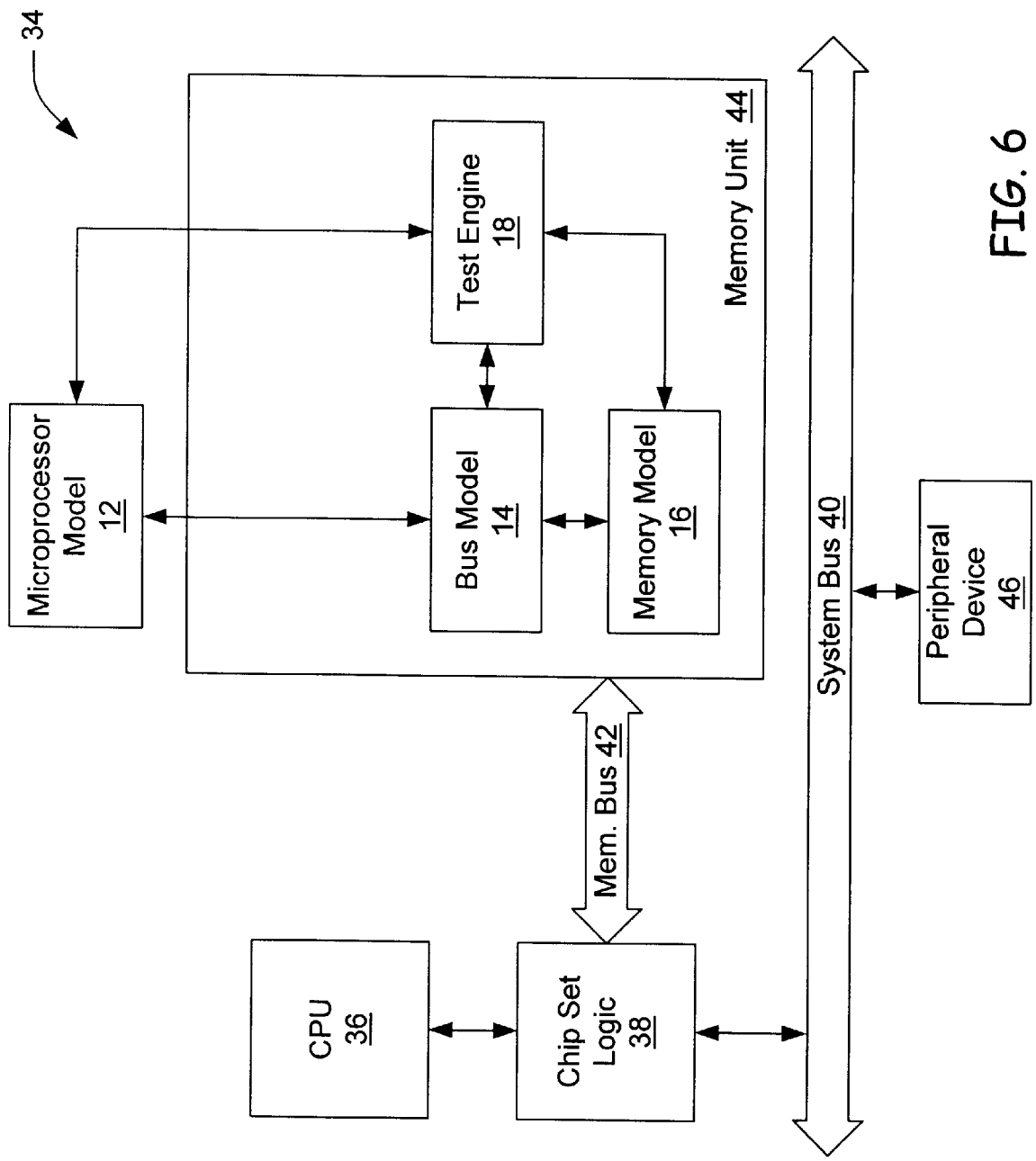

METHOD FOR EVENT-RELATED FUNCTIONAL TESTING OF A MICROPROCESSOR

BACKGROUND OF THE INVENTION

1. Field of the Invention

This invention relates to the manufacture of integrated circuits and more specifically to the functional verification of a microprocessor.

2. Description of the Relevant Art

Today's microprocessor market is characterized by a number of manufacturers competing to supply the needs of customers demanding higher performance products. In this environment, a microprocessor manufacturer stands to profit most by being the first to introduce a new product which is superior to products offered by competitors. The ability to be first to market with a superior product requires shortening the microprocessor product development cycle as much as possible.

Before the first working prototype of a new microprocessor is manufactured, a functional model of the new microprocessor is tested extensively to ensure the new design meets a set of functional specifications. Due to the increasing complexity of modern microprocessors, a substantial amount of time is spent during product development in verifying that the functional model of the new microprocessor operates correctly. Thus the product development cycle may be shortened significantly by improving the efficiency of the functional verification process.

A microprocessor must be able to correctly execute instructions of a computer program while responding to one or more control signals. Such control signals include, for example, interrupt signals and bus arbitration signals. As used herein, the term "interrupt" refers to a control signal which indicates a high-priority request for service from a device operably coupled to the microprocessor. For example, a peripheral device which is ready to transmit data to or receive data from the microprocessor may assert an interrupt signal. Originating from outside the microprocessor, an interrupt is ordinarily not synchronized with a system clock signal which orchestrates the internal activities of the microprocessor.

Bus arbitration signals are used to control access to a common bus when signal lines of the microprocessor and at least one other device capable of bus control (i.e., at least one other bus master) are coupled to the common bus. A bus master receiving an input bus arbitration signal stops driving some or all of the signal lines coupled to the bus in order to allow another bus master to control the corresponding signal lines of the bus.

A microprocessor is typically coupled to one or more external memory units which store sets of instructions and data (i.e., computer programs). An application program is a computer program which performs a specific function and is designed to operate within a controlled environment provided by an operating system. An operating system is a collection of computer programs which provide file management and input/output control functions. MS-DOS® and Windows NT™ (Microsoft Corp.) are common operating systems.

The two general categories of types of interrupts are "non-maskable" and "maskable". A single non-maskable interrupt (NMI) signal line of the microprocessor is typically reserved for informing the microprocessor that a catastrophic event has occurred or is about to occur. Examples of non-maskable interrupts include bus parity error, failure of a critical hardware component such as a timer, and imminent loss of electrical power. Maskable interrupts are lower-priority requests for service which will not result in catastrophic events if not honored immediately. Maskable interrupts may be ignored by the microprocessor under program control. A request for service Gofrom a peripheral device which is ready to transmit data to or receive data from the microprocessor is an example of a maskable interrupt. A programmable interrupt controller (PIC) typically receives maskable interrupt requests from devices coupled to the microprocessor, prioritizes the interrupt requests, and activates a single maskable interrupt (IRQ) signal line of the microprocessor as required.

A section of the lowermost portion of the physical address space of a microprocessor is typically dedicated to operating system functions. During microprocessor initialization, a typical operating system loads an interrupt vector table into the lowermost 1,024 (1 k) bytes of an external memory unit starting at memory location 0000_0000h. The interrupt vector table contains the starting addresses of interrupt service routines. The interrupt service routines are themselves computer programs, and are typically stored in the lowermost portion of the external memory unit along with the interrupt vector table.

When a microprocessor receives an interrupt, application program execution stops, the contents of certain critical registers are saved (i.e., the internal state of the microprocessor is saved), and internal control is transferred to an interrupt service routine (i.e., an interrupt handler) which corresponds to the type of interrupt received. In the case of a maskable interrupt, the PIC typically identifies the interrupt to be serviced (i.e., provides a number assigned to the interrupt) during an interrupt acknowledge operation. A non-maskable interrupt is typically assigned a specific interrupt number, and no interrupt acknowledge operation takes place. The microprocessor uses the interrupt number as an index into the interrupt vector table to obtain the address of the appropriate interrupt service routine. When the interrupt service routine is completed, the saved contents of the critical registers are restored (i.e., the state of the microprocessor is restored), and the microprocessor resumes application program execution at the point where execution was interrupted.

Other than the time required to accomplish an interrupt service routine, or to relinquish and regain control of signal lines coupled to a common bus as a result of bus arbitration, the handling of an interrupt signal or a bus arbitration signal should not affect application program execution. It is possible, however, for an error in the design of the microprocessor, or a defect introduced into the microprocessor during manufacturing, to cause the microprocessor to produce an incorrect result when responding to a control signal during a given microprocessor activity. A complete verification of the operation of a microprocessor must thus involve ensuring the microprocessor produces correct results during all microprocessor activities, and when control signals (e.g., interrupt or bus arbitration signals) are received by the microprocessor during performance of the microprocessor activities.

Due to a lack of software tools, evaluation of a microprocessor's ability to correctly respond to control signals has typically been delayed until after the fabrication of one or more working prototypes. It would be desirable, however, to have a software tool which would allow testing of the functional model of a microprocessor to determine the microprocessor's ability to correctly respond to control signals before the manufacture of a working prototype. Such a tool would allow earlier detection and correction of design errors, potentially shortening the development cycle of a new microprocessor product.

SUMMARY OF THE INVENTION

The problems outlined above are in large part solved by a method for event-related functional testing of a microprocessor. The present method employs a model of the microprocessor coupled to a control signal generator. The microprocessor model is programmed to produce a trigger event signal, to perform a target activity, and to respond to a control signal. The target activity occurs over several cycles of a system clock signal. The control signal generator receives the trigger event signal and generates the control signal a selectable number of system clock signal cycles (i.e., a delay time) after the trigger event is received. The delay time is selected such that the control signal generator generates the control signal during the time period when the microprocessor model is performing the target activity.

A testing program includes a program loop which causes the microprocessor model to produce the trigger event signal, perform the target activity in order to produce a test result, and to compare the test result to an expected result. The delay time is initialized to the number of system clock cycles occurring between the trigger event signal and the first system clock cycle of the target activity, and is incremented each time the program loop is executed. The program loop is repeatedly executed as long as the microprocessor model responds to the control signal during the target activity and the test result matches the expected result. If the test result matches the expected result during each execution of the program loop, the microprocessor demonstrates the ability to properly respond to a control signal while performing the target activity.

The microprocessor model may use software instructions to simulate the operations of the microprocessor under test. Alternately, the microprocessor model may use one or more electronic devices to emulate the operations of the microprocessor under test. The microprocessor model may thus be implemented in software or hardware. A software implementation of the microprocessor model includes a set of instructions from a defined programming language or a hardware design language. Suitable programming languages include C and C++. Suitable hardware design languages include Verilog and the VHSIC hardware description language (VHDL). A hardware implementation of the microprocessor model may be formed by programming a programmable logic device (PLD) according to a functional specification of the microprocessor to be modeled. Suitable PLDs include various types of programmable logic arrays (PLAS) and field programmable gate arrays (FPGAs).

The microprocessor model functions as a part of a microprocessor test group. The microprocessor test group includes the microprocessor model, a memory model, a bus model coupled between the microprocessor model and the memory model, and a test engine. The memory model is configured to store data and includes a memory control unit. The memory control unit includes the control signal generator. The bus model facilitates the transfer of data between the microprocessor model and the memory model, and includes representations of address signal lines, data signal lines, and control signal lines. The test engine is configured to initiate execution of the testing program by the microprocessor model and to check for proper operation of the other elements of the microprocessor test group during execution of the testing program. The bus model, the memory model, and the test engine are implemented in software.

Software elements of the microprocessor test group are contained within a memory unit of a microprocessor testing system during testing. The microprocessor testing system includes a central processing unit (CPU), chip set logic, a system bus, a memory bus, and a memory unit. The CPU is configured to execute instructions. The system bus is adapted for coupling to one or more peripheral devices. The chip set logic forms an interface between the CPU and the system bus, and between the CPU and the memory bus. The memory bus is used to transfer data between the CPU and the memory unit via the chip set logic. The memory unit is coupled to the memory bus and is configured to store data. In a first embodiment of the microprocessor testing system, the microprocessor model is a software implementation, and all of the elements of the microprocessor test group are contained within the memory unit of the microprocessor testing system during testing. In a second embodiment of the microprocessor testing system, the microprocessor model is a separate hardware implementation coupled to the bus model and to the test engine, and the remaining elements of the microprocessor test group are contained within the memory unit of the microprocessor testing system during testing.

BRIEF DESCRIPTION OF THE DRAWINGS

Other objects and advantages of the invention will become apparent upon reading the following detailed description and upon reference to the accompanying drawings in which:

FIG. 6 is a block diagram of an alternate embodiment of the microprocessor testing system configured to perform functional testing upon a hardware implementation of the microprocessor model.

Figure 1:
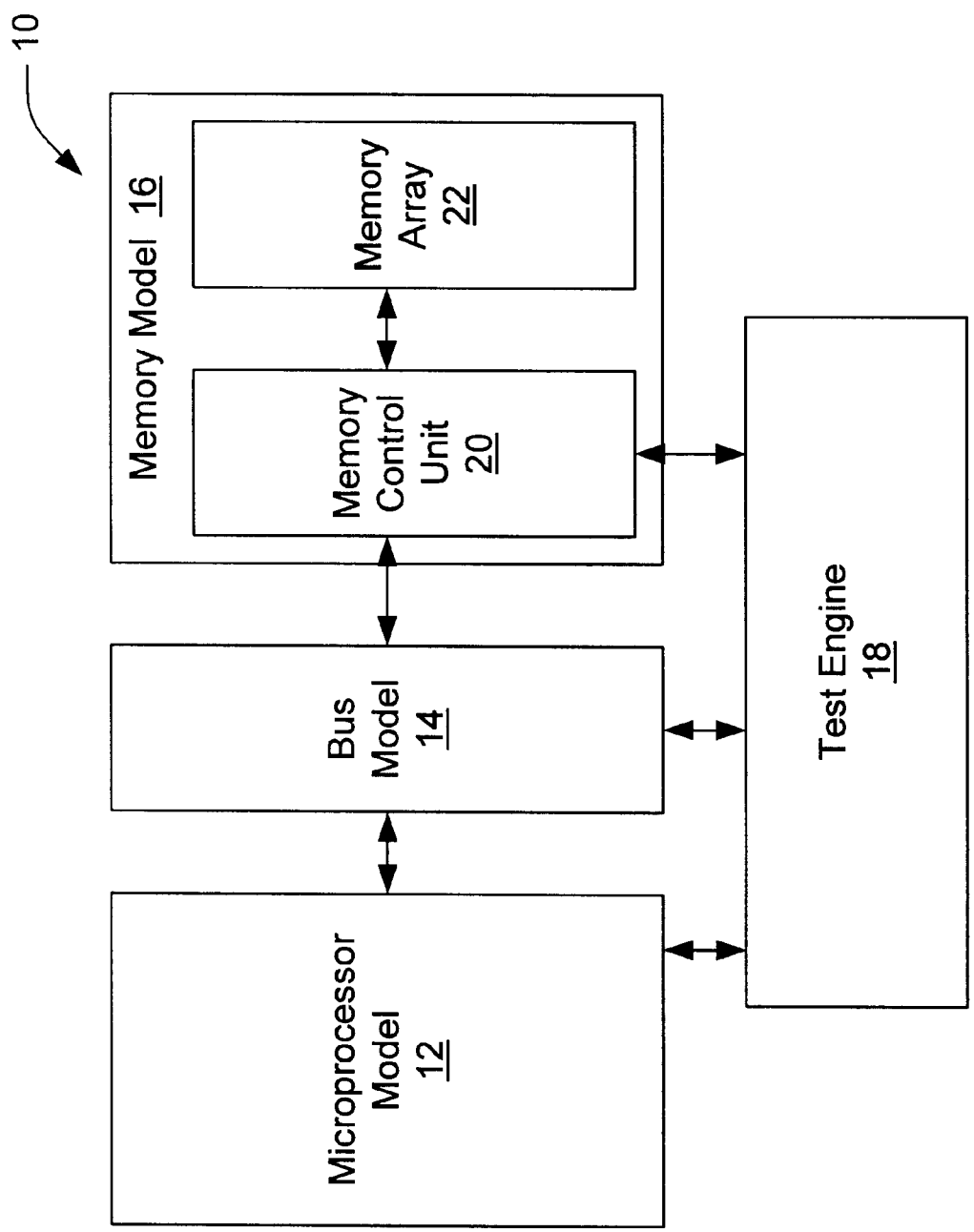
FIG. 1 is a block diagram of a microprocessor test group including a microprocessor model coupled to a memory model, wherein the memory model includes a memory control unit, and wherein the memory control unit includes a control signal generator.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

In order to test the ability of a microprocessor under test to properly respond to a control signal (e.g., an interrupt or bus arbitration signal), it is necessary to have the ability to cause the control signal to occur during any given microprocessor activity. This involves being able to determine when a selected "target" activity starts and ends, as well as the ability to control the occurrence of the control signal such that the control signal is received by the microprocessor under test during the target activity. Examples of candidate target activities include page table accesses and instruction and data fetches from an external memory unit coupled to the microprocessor under test.

An apparatus used to carry out the present invention will now be described. FIG. 1 is a block diagram of a microprocessor test group 10 including a microprocessor model 12. Microprocessor model 12 is an operational model of the microprocessor under test. Microprocessor model 12 is configured to execute instructions, preferably x86 instructions. Microprocessor test group 10 also includes a bus model 14, a memory model 16, and a test engine 18. Bus model 14 is coupled to microprocessor model 12, and models the address, data, and control signal lines of a typical microprocessor bus structure. Memory model 16 is coupled to bus model 14, and models a memory system. Memory model 16 is configured to store data. Microprocessor model 12 fetches data (i.e., reads) from memory model 16 via bus model 14, and stores data (i.e., writes) to memory model 16 via bus model 14. Memory model 16 also generates a system clock signal 'CLK' and various control signals. The control signals include interrupt and bus arbitration signals. System clock signal 'CLK' and the control signals are coupled to signal lines of microprocessor model 12 via bus model 14. System clock signal 'CLK' coordinates the activities of microprocessor model 12, bus model 14, and memory model 16. Test engine 18 is coupled to microprocessor model 12, bus model 14, and memory model 16. Test engine 18 is configured to initiate execution of the testing program by microprocessor model 12 and to check for proper operation of the other elements of the microprocessor test group during execution of the testing program.

Microprocessor model 12 may be implemented in software or hardware. A software implementation of microprocessor model 12 includes a set of instructions from a defined programming language or a hardware design language. Suitable programming languages include C and C++. C and C++ are classified as high-level computer programming languages along with FORTRAN, COBOL, BASIC, Pascal, and Ada. C and C++ statements (i.e., instructions) and associated data may be grouped together into functions which represent the operations performed by functional units and subsystems of a microprocessor. A computer program called a compiler is typically used to translate C and C++ programs into machine language instructions of the processor of the computer system upon which the compiled program will be executed. In a similar manner, the C or C++ instructions included in a model of a microprocessor are compiled into machine language instructions of the processor of the computer system upon which they will be simulated. Simulation of a software implementation of a microprocessor model involves loading the compiled instructions and associated data of the microprocessor model into the memory unit of a computer system, providing a set of instructions and data (i.e., a testing program) which the microprocessor model may access, and initiating execution of the testing program by the microprocessor model.

In a programming language such as C and C++, a signal may be represented as a value stored in one or more bit positions of a multiple-bit storage location within a memory unit. For example, a 16-bit storage location may be used to store as many as 16 single-bit signal values, each of which may be in one of two logic states (e.g., either a logic '0' state or a logic '1' state). Furthermore, the storage location as a whole may represent a bus structure with 16 separate signal lines, each of which may be in either a logic '0' state or a logic '1' state. Alternately, the storage location may be used to represent one 16-bit register, two 8-bit registers, etc. Storage locations of a memory unit may be modeled as a declared array.

Functional units and subsystems of a microprocessor may be modeled behaviorally, algorithmically, or structurally. A behavioral model of a functional unit or subsystem includes a set of equations which generate output signals from the values of input signals. An algorithmic model of a functional unit or subsystem generates the values of output signals from the values of input signals according to a predefined sequence of steps. A structural model of a functional unit or subsystem includes a group of interconnected logic gate models which generate output signals from the values of input signals. The logic gates themselves may be represented structurally, behaviorally, or algorithmically. For example, a subsystem which generates an output signal 'c' from input signals 'a' and 'b' according to the exclusive OR function may be modeled behaviorally using:

$$c = a \oplus b$$

where '$\oplus$' is the exclusive OR operator. The same subsystem may be modeled algorithmically by initializing the logic value of 'c' to '0', summing the logic values of 'a' and 'b', and setting the value of 'c' to '1' only if the sum is equal to '1'. A structural model of the subsystem may be formed using models of a two-input OR gate, a two-input NAND gate, and a two-input AND gate. The inputs to the OR gate and the NAND gate models are signals 'a' and 'b', the output of the NOR gate model is one input to the AND gate model, and the output of the NAND gate model is the other input to the AND gate model. The output of the AND gate model is 'c', where the value 'c' is determined by the interconnected logic gate models and is equal to 'a$\oplus$b'.

A hardware design language may also be used to implement a software implementation of microprocessor model 12. Suitable hardware design languages include Verilog and the VHSIC hardware description language (VHDL). Hardware description languages are high-level languages specifically adapted to model electronic circuits and systems. Verilog is patterned after the C programming language, and VHDL is patterned after the Ada programming language. Verilog and VHDL include built-in hardware constructs such as signals ('events' in Verilog), standard logic gates, registers, and buses. Built-in functions model standard logic gates in VHDL and Verilog. During simulation, the output signals produced by modeled logic gates are determined from the values of the input signals. Signals in VHDL and events in Verilog are defined and manipulated just as variables are defined and manipulated in a high-level programming language. A bus is normally represented as a declared linear array (i.e., a vector) of storage locations within a memory unit. The storage locations store the logic states of the signal lines of the bus (e.g., '0', '1', and 'Z', where 'Z' is a high-impedance state). Storage locations of memory units may be modeled as declared arrays. Functional units and subsystems may be modeled behaviorally, algorithmically, or structurally as described above. Software models written in Verilog or VHDL are typically simulated as described above. The software model may also be "translated" into geometric data which completely describes the layout of an integrated circuit which performs the functions of the model (i.e., a hardware implementation of the model) by a computer program referred to as a silicon compiler or synthesizer.

A hardware implementation of microprocessor model 12 may be formed by programming a programmable logic device (PLD) according to a functional specification of the microprocessor to be modeled. PLDs are general-purpose digital components which are manufactured in an "unprogrammed" state, and are later "programmed" to implement a desired logical function. A PLD is typically programmed by a sequence of electrical pulses which configure an array of switches within the PLD. Suitable PLDs include various types of programmable logic arrays (PLAs) and field programmable gate arrays (FPGAs). A PLA is a PLD having at least one array of internal switches which may be configured to implement any combinational logic function as a sum of product terms (i.e., a sum of products) of one or more input signals. FPGAs are semi-custom logic devices including "islands" of programmable logic blocks called "logic cells" surrounded by an interconnection network which includes programmable switches. The logical functions performed by the logic cells are determined by programming, as are the interconnections formed between the logic cells. PLAs and FPGAs may also include storage elements called flip-flops.

Bus model 14, memory model 16, and test engine 18 are implemented in software. Software implementations include a set of instructions from a defined programming language or a hardware design language as described above. Software instructions and data arising from these components are configured within a memory unit during use. The memory unit is accessible by a microprocessor testing system. Bus model 14, memory model 16, and test engine 18 are preferably implemented in a suitable hardware design languages such as Verilog or VHDL. Memory model 16 includes a memory control unit 20 and a memory array 22. Memory array 22 is configured to store data and includes storage locations of the memory unit. Memory control unit 20 includes software instructions which save data to, and retrieve data from, storage locations within memory array 22. Memory control unit 20 also includes a special functional unit described below which generates system clock signal 'CLK' and various control signals.

Figure 2:
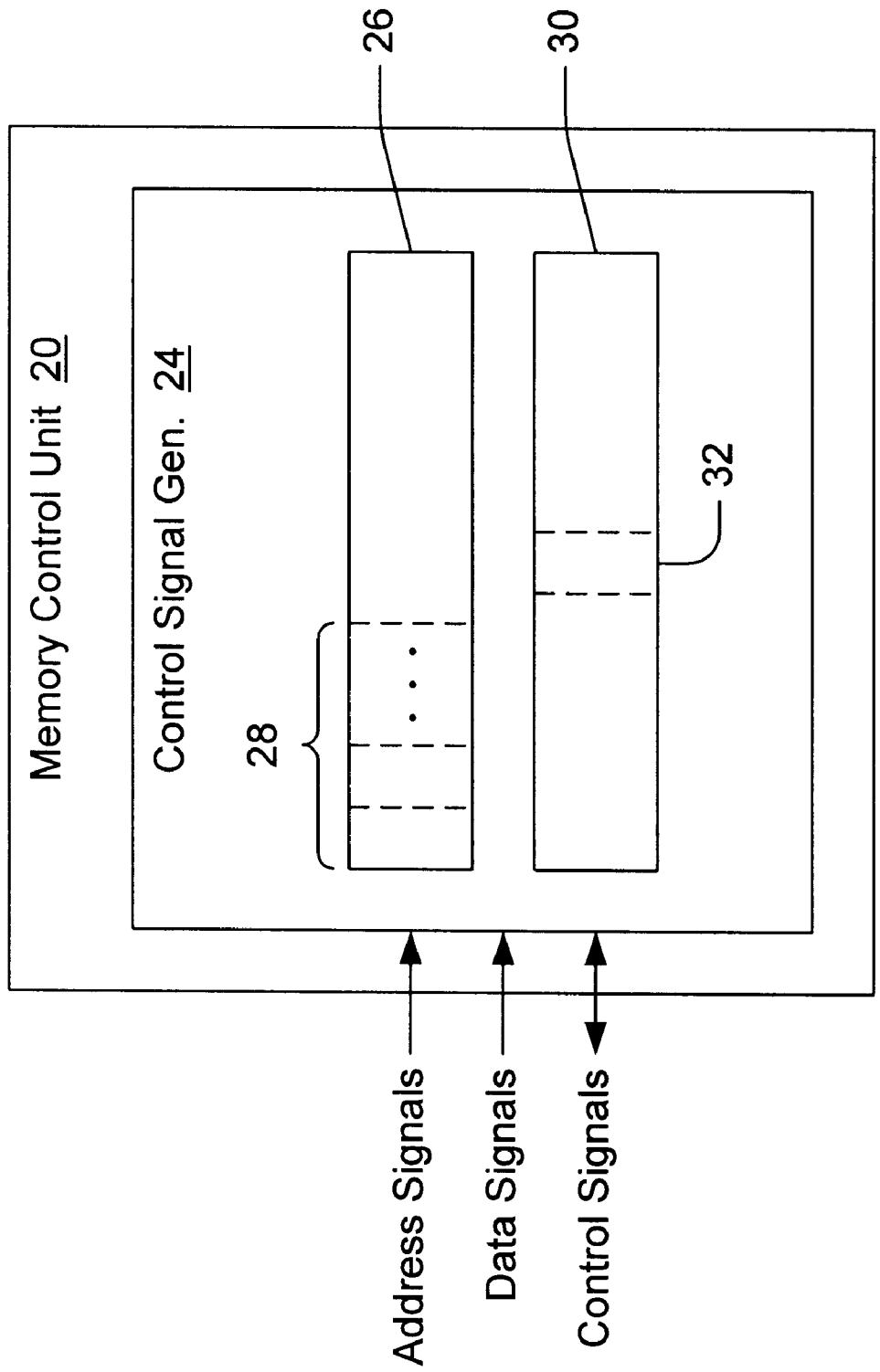
FIG. 2 is a block diagram of a preferred embodiment of the memory control unit, wherein the control signal generator includes a control register and a status register, and wherein the control signal generator is configurable to generate a chosen control signal a selectable number of system clock cycles (i.e., a delay time) following detection of a trigger event.

FIG. 2 is a block diagram of a preferred embodiment of memory control unit 20 including a control signal generator 24. Control signal generator 24 receives address, data, and control signals via bus model 14. Control signal generator 24 is configurable to generate a chosen control signal a selectable number of system clock cycles (i.e., a delay time) following detection a trigger event. The trigger event is a predetermined combination of signals present simultaneously upon the address, data, and control signal lines of bus model 14. During testing program execution, address, data, and control signals generated by microprocessor model 12 are stored within storage locations of bus model 14. Control signal generator 24 receives the values of the address, data, and control signals and compares them to the predetermined trigger event signals in order to determine if the trigger event has occurred. If control signal generator 24 detects the trigger event, control signal generator 24 generates the chosen control signal after the delay time elapses.

The types of control signals produced by control signal generator 24 include interrupt and bus arbitration signals. Examples of common x86 microprocessor interrupt signals include non-maskable interrupt (NMI), maskable interrupt (INTR), reset (RESET), and stop clock (STPCLK#). Examples of common x86 bus arbitration signals include bus hold (HOLD) and Backoff (BOFF#). In response to an asserted HOLD or BOFF# signal, an x86 microprocessor will cease driving signal lines coupled to a shared bus in order to allow another bus master to control the bus.

Control signal generator 24 includes a control register 26. Control register 26 is configured to store data, and may be accessed using address and control signals just like a storage location within memory array 22. In other words, control register 26 is an "addressable" register. For example, data may be stored in control register 26 by a write operation to the address assigned to control register 26, and data stored within control register 26 may be retrieved by a read operation to the address assigned to control register 26.

Control register 26 includes a delay time field 28 in which the delay time value is stored. Delay time field 28 includes a number of contiguous bit locations, preferably 16 contiguous bit locations. Control register 26 also includes other bit locations. Values stored in one or more of these other bit locations enable generation of the chosen control signal by control signal generator 24.

Control signal generator 24 also includes status register 30. Status register 30 is also an addressable register, and is used to store control signal generation status information. Status register 30 includes a flag bit 32 which indicates generation of the chosen control signal by control signal generator 24. When control signal generator 24 generates the control signal, control signal generator 24 stores (i.e., writes) a '1' to flag bit 32 of status register 30.

Flag bit 32 of status register 30 is used to determine if control signal generator 24 generated the chosen control signal during a given time period. In order to do so, a '0' is written to flag bit 32 (i.e., flag bit 32 is set to '0') just prior to the beginning of the time period. Just after the end of the time period, the value stored within flag bit 32 is retrieved (i.e., read). If flag bit 32 contains a '0' at the end of the time period, control signal generator 24 did not generate the control signal during the time period. If flag bit 32 contains a '1' at the end of the time period, control signal generator 24 generated the control signal during the time period. Reading the contents of status register 30 preferably sets the value of flag bit 32 to '0', thus allowing a read operation and a subsequent initialization operation to be combined into a single operation.

Figure 3:
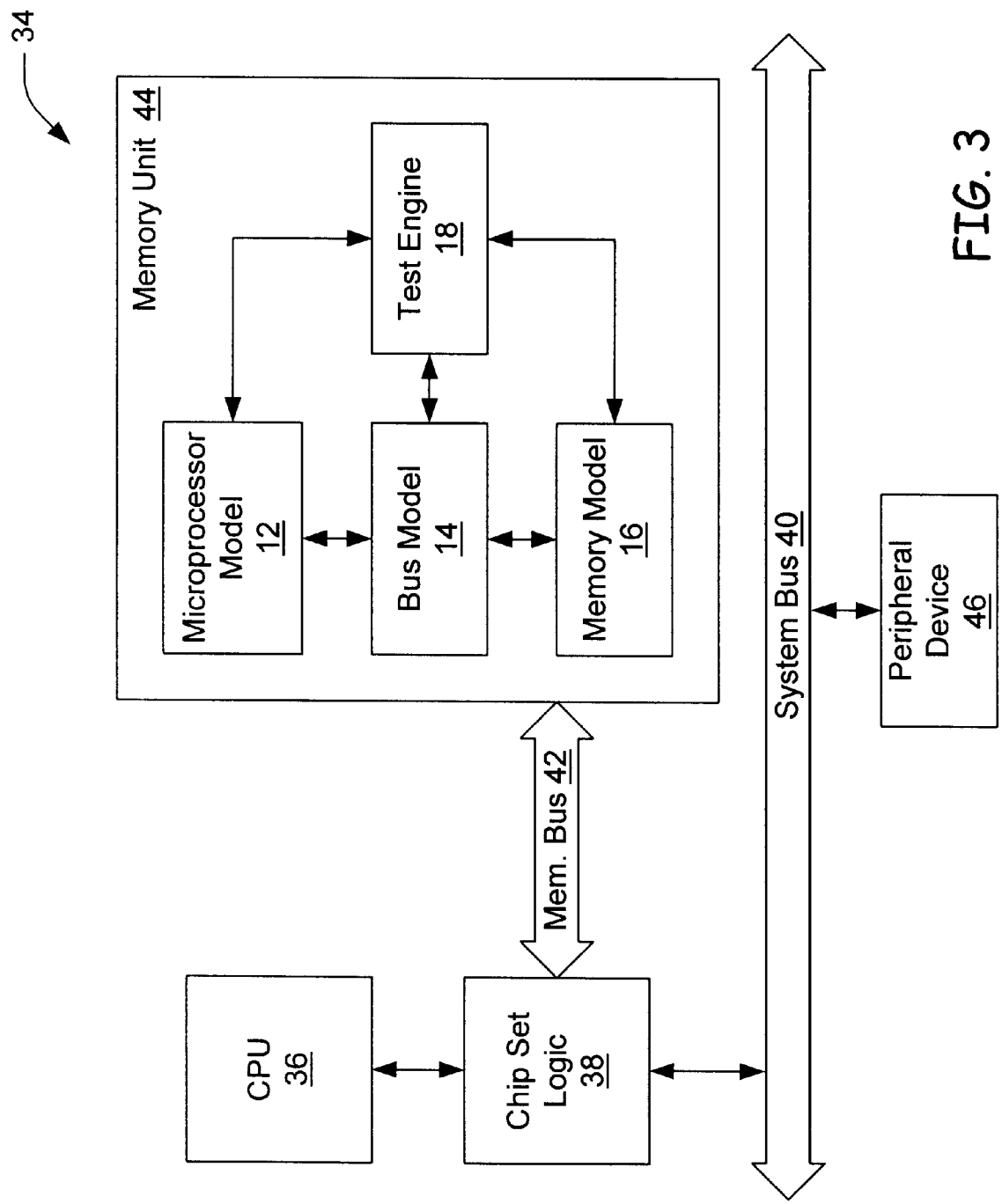
FIG. 3 is a block diagram of one embodiment of a microprocessor testing system configured to perform functional testing upon a software implementation of the microprocessor model.

FIG. 3 is a block diagram of one embodiment of a microprocessor testing system 34 configured to perform functional testing upon a software implementation of microprocessor model 12. Microprocessor testing system 34 includes a central processing unit (CPU) 36 coupled to chip set logic 38. Chip set logic 38 is coupled to a system bus 40 and a memory bus 42. A memory unit 44 is coupled to memory bus 42. A peripheral device 46 is coupled to system bus 40. Peripheral device 46 may be, for example, a disk drive unit, a video display unit, or a printer. CPU 36 obtains data (i.e., reads) from memory unit 44 via chip set logic 38, and stores data (i.e., writes) to memory unit 44 via chip set logic 38. Chip set logic 38 functions as interface between CPU 36 and system bus 40, and between CPU 36 and memory unit 44. Chip set logic 38 preferably includes a memory controller. Memory unit 44 is configured to store data, and preferably includes semiconductor memory devices. During use of microprocessor testing system 34, memory unit 44 includes all elements of microprocessor test group 10 as shown.

During functional testing, test engine 18 initiates execution of the testing program, stored within memory model 16, by microprocessor model 12. The testing program includes instructions and data. The instructions belong to an instruction set of microprocessor model 12. The target activity is typically performed over two or more cycles of system clock signal 'CLK'. The testing program includes a program loop which causes microprocessor model 12 to repeatedly generate the trigger event, perform a selected target activity, and to produce a test result. Prior to the execution of the program loop for the first time, the delay time value is initialized to the number of system clock signal cycles occurring between the trigger event and the first system clock cycle of the target activity. Thus the first time the program loop is executed, the control signal is generated during the first system clock signal cycle of the target activity. Each time he program loop is executed, the delay time is incremented by the smallest amount of time detectable by the processor, a single cycle of the system clock signal. During execution of the program loop, control signal generator 24 detects the trigger event and generates the chosen control signal after the current delay time expires following the trigger event. At the end of the program loop, the test result is compared to an expected result derived from a specification of the microprocessor under test. Program loop execution continues as long as microprocessor model 12 continues to produce a test result which matches an expected result (i.e., a correct test result) while handling the chosen control signal during successive system clock signal cycles of the target activity.

Figure 4:
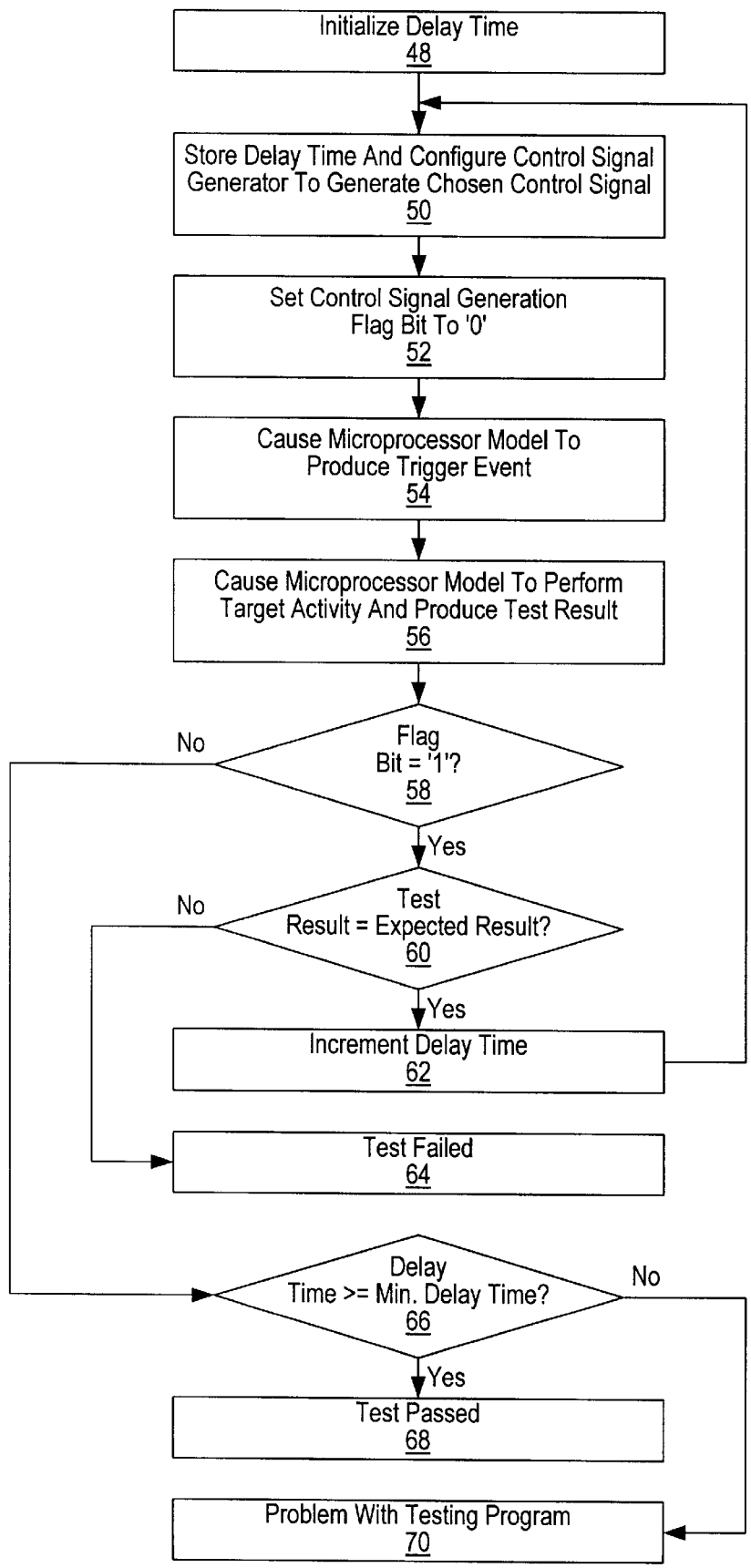
FIG. 4 is a flow chart of a testing program executed by the microprocessor model during functional testing, wherein the testing program includes a program loop, and wherein the program loop causes the microprocessor model to perform a target activity.

FIG. 4 is a flow chart of the testing program executed by microprocessor model 12 during testing. During a first step 48, the delay time is initialized as described above. When the trigger event occurs during the first system clock signal cycle of the target activity, the delay time is initialized with a value of '0'. The delay time is stored within delay time field 28 of control register 26 within control signal generator 24 during a step 50. The values of other bit locations within control register 26 are set such that signal generator 24 is configured to generate the chosen control signal after the delay time expires following the trigger event. During a step 52, flag bit 32 of status register 30 within control signal generator 24 is set to '0', preferably by simply reading the value stored within status register 30 as described above. Microprocessor model 12 is caused to produce the trigger event during a step 54. During a step 56, microprocessor model 12 is caused to perform the target activity and to produce a test result. The content of flag bit 32 of status register 30 within control signal generator 24 is checked during a step 58.

If flag bit 32 contains a '1' during step 58, control signal generator 24 generated the control signal during the target activity, and a step 60 is executed. During step 60 the test result is compared to the expected result. If the test result matches the expected result during step 60, the delay time is incremented during a step 62 and step 50–58 are repeated. If the test result does not match the expected result during step 60, the test is failed (step 64). Further diagnosis is required to determine if the test failure is due to a design error within microprocessor model 12.

If flag bit 32 contains a '0' during step 58, control signal generator 24 did not generate the control signal during the target activity, and a step 66 is executed. During step 66 a check is performed to validate the testing program. The current delay time value is compared to a predetermined minimum delay time value in order to ensure the program loop was executed a minimum number of times. If the delay time value is greater than or equal to the minimum delay time value during step 66, the test is passed (step 68). If the delay time value is less than the minimum delay time value during step 66, a problem with the testing program is indicated (step 70).

Steps 50–60 of the testing program are repeated as long as microprocessor model 12 continues to produce a correct test result and the control signal is generated during the target activity. Steps 50–60 represent the program loop of the testing program. Execution of the program loop ideally continues until the time delay value exceeds the number of system clock cycles required to perform the target activity.

The trigger event produced by microprocessor model 12 during testing program execution must be produced at the same time during each execution of the program loop. In order to increase performance, some microprocessors save data to be written to a memory unit in a collection of temporary storage locations (i.e., a write buffer). Such "buffered writes" are saved to the memory unit when the bus coupling the microprocessor and the memory unit is not being used to fetch required instructions or data. In this case, the exact time that the trigger event occurs may differ each time the program loop is executed. It is therefore desirable that an instruction which generates the trigger event be an instruction which is completed before the microprocessor executes the next instruction in the test program.

Several microprocessors complete I/O write instructions before executing subsequent instructions. The x86 'out' instruction is such an instruction, and may be advantageously employed to generate the trigger event in a reliable and predictable fashion. Microprocessor execution of the machine code version of an x86 'out' such as 'out 20h, eax' thus adds necessary predictability to the production of the trigger event. Execution of the 'out 20h, eax' instruction causes the microprocessor to write the value within the 'eax' register to an input/output (I/O) device associated with address '20h' during an I/O bus cycle.

Figure 5A:
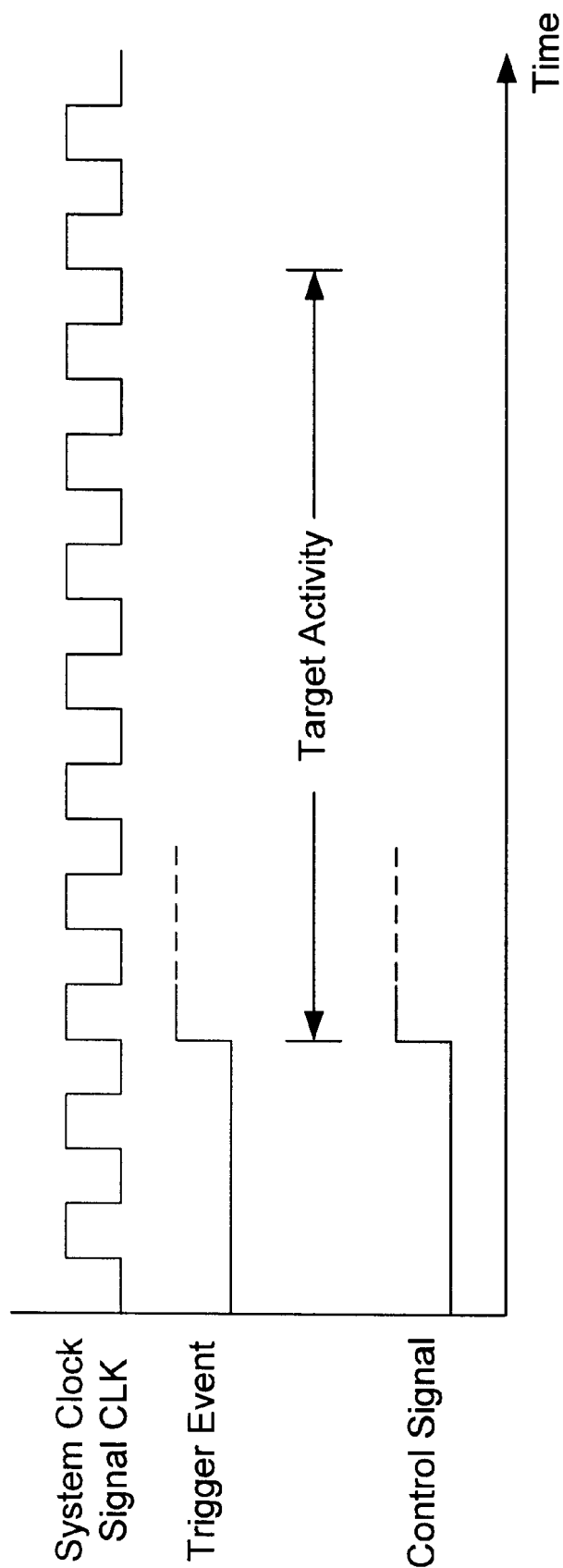
FIG. 5a is a timing diagram of the generation of the chosen control signal during the first execution of the program loop of the testing program, wherein the chosen control signal is generated during a first system clock signal cycle of the target activity.
Figure 5B:
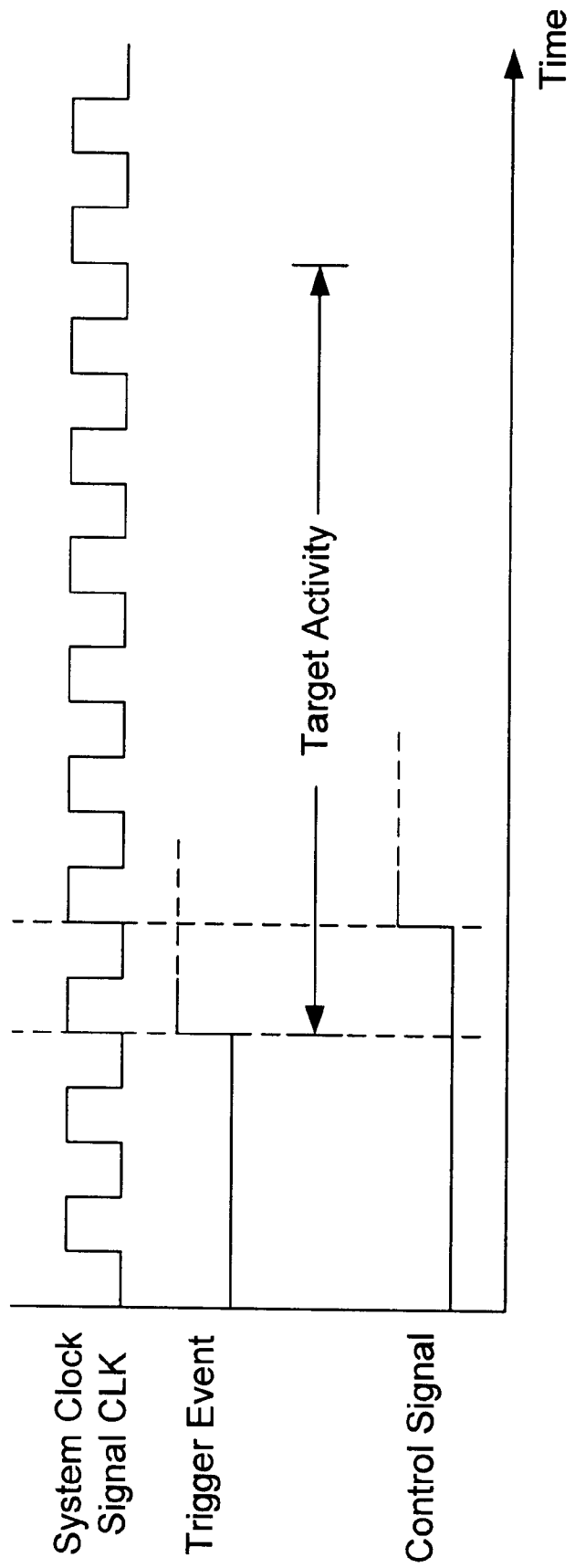
FIG. 5b is a timing diagram of the generation of the chosen control signal during the second execution of the program loop of the testing program, wherein the chosen control signal is generated during a second system clock signal cycle of the target activity.
Figure 5C:
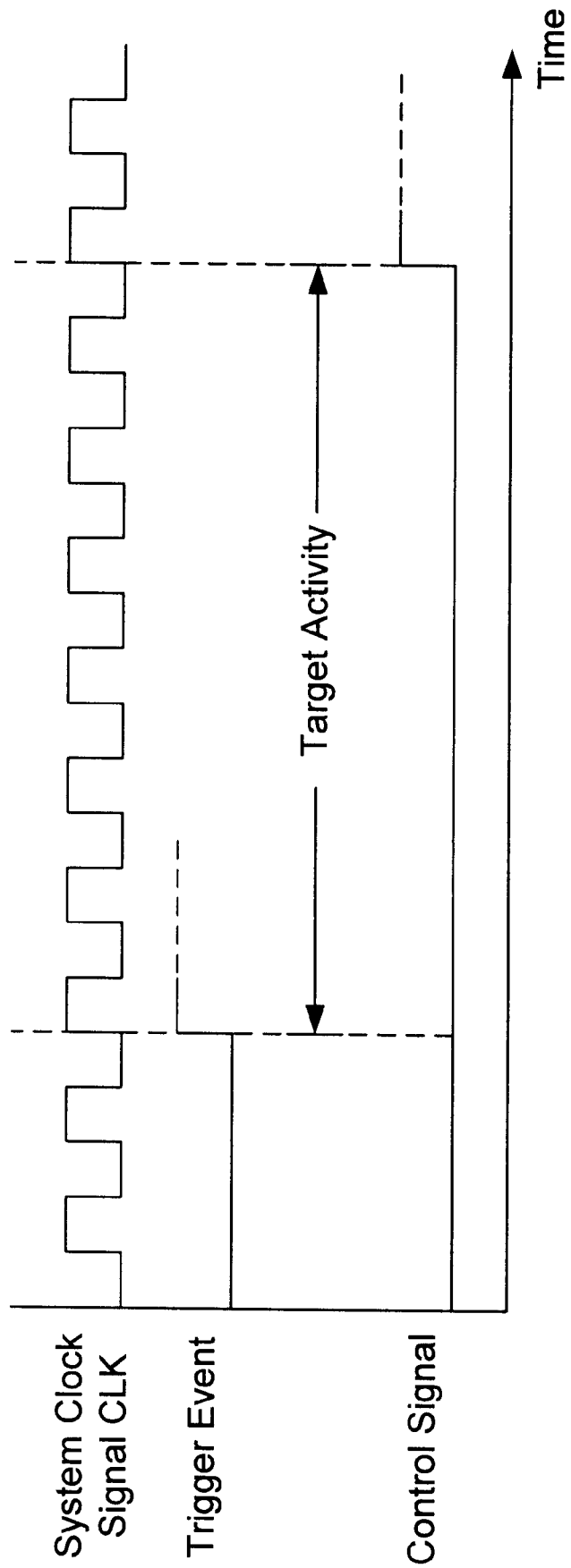
FIG. 5c is a timing diagram of the generation of the chosen control signal during the final execution of the program loop of the testing program, wherein the chosen control signal is not generated during the target activity.

FIGS. 5a–c are timing diagrams illustrating the generation of the control signal during execution of the testing program. Each timing diagram shows the logic values of the system clock signal 'CLK', the trigger event, and the control signal. Performance of a target activity requiring 7 cycles of the system clock 'CLK' is also indicated. The rising edge of the trigger event represents occurrence of the trigger event, and the rising edge of the control signal represents assertion of the chosen control signal. Prior to the first execution of the program loop, the delay time is initialized to 0 during step 48. A minimum delay time value of 2 is selected for the comparison during step 66 to ensure the program loop is executed at least three times.

FIG. 5a is a timing diagram of the generation of the control signal during the first execution of the program loop.

As shown, the control signal generator generates the control signal during the same system clock cycle that the trigger event is generated. As a result, the control signal is generated during the first system clock signal cycle of the target activity. Following confirmation that the control signal was generated during performance of the target activity and a successful comparison of the test result and the expected result, the delay time is incremented to 1 and the program loop is executed a second time.

FIG. 5b is a timing diagram of the generation of the control signal during the second execution of the program loop. The delay time is 1, and the control signal generator generates the control signal 1 system clock cycle following the generation of the trigger event signal. As a result, the control signal is generated during the second system clock signal cycle of the target activity. The program loop is again executed following confirmation that the control signal was generated during the target activity and that microprocessor model 12 produced a correct result, and incrementing of the delay time.

FIG. 5c is a timing diagram of the generation of the control signal during the eighth and final execution of the program loop. The delay time value is 7, and the control signal generator generates the control signal 7 system clock cycles following the generation of the trigger event signal. The target activity is complete when the control signal is generated, thus the control signal is not generated during the target activity. During step 58, the value of flag bit 32 of status register 30 is '0', and the program loop is exited. During step 66, the delay time value of 7 is greater than the minimum delay time value of 2, and the test is passed.

It is noted that when there is uncertainty as to when the target activity begins, the trigger event may be generated before the first system clock signal cycle of the target activity. In this case, generation of test results which match expected results during each execution of the program loop demonstrates the ability of the microprocessor to properly respond to the control signal while performing the target activity.

FIG. 6 is a block diagram of an alternate embodiment of microprocessor testing system 34 configured to perform functional testing upon a hardware implementation of microprocessor model 12. In FIG. 6, memory unit 44 includes only bus model 14, memory model 16, and test engine 18 of microprocessor test group 10. Microprocessor model 12 is external to memory unit 44, and is coupled to bus model 14 and test engine 18 via input/output (I/O) ports and physical conductors. During use, test engine 18 initiates testing program execution by microprocessor model 12. Testing program execution proceeds as described above.

It will be appreciated by those skilled in the art having the benefit of this disclosure that this invention is believed to be a method for event-related functional testing of a microprocessor. Furthermore, it is also to be understood that the form of the invention shown and described is to be taken as exemplary, presently preferred embodiments. Various modifications and changes may be made without departing from the spirit and scope of the invention as set forth in the claims. It is intended that the following claims be interpreted to embrace all such modifications and changes.

What is claimed is:

1. A method for performing functional testing upon a microprocessor, comprising:

providing a model of the microprocessor adapted to perform an activity of interest and to respond to a control signal, and wherein the activity of interest occurs over a plurality of clock cycles;

producing a trigger event signal from the microprocessor model prior to initiating performance of the activity of interest;

using the trigger event signal to generate the control signal during one of the plurality of clock cycles such that the microprocessor model responds to the control signal;

comparing a test result produced during the activity of interest to an expected result;

repeating the producing, using, and comparing steps until the microprocessor model has responded to the control signal during each of the plurality of clock cycles occurring during the activity of interest; and verifying proper operation of the microprocessor during the activity of interest by matching the test result to the expected result during each execution of the comparing step.

2. The method as recited in claim 1, wherein the activity of interest comprises at least one activity of a plurality of activities which occur within the microprocessor.

3. The method as recited in claim 1, wherein the activity of interest is initiated by an instruction forwarded to the microprocessor model.

4. The method as recited in claim 1, wherein the control signal comprises an interrupt signal or a bus arbitration signal.

5. The method as recited in claim 1, wherein the trigger event signal is a predetermined combination of address, data, and control signals.

6. The method as recited in claim 1, wherein the occurrence of the trigger event signal indicates initiation of the activity of interest.

7. The method as recited in claim 1, wherein the using step comprises providing a control signal generator operably coupled to receive the trigger event signal and configured to produce the control signal in response to the trigger event signal.

8. The method as recited in claim 7, wherein a system clock signal is coupled to the microprocessor model and to the control signal generator.

9. The method as recited in claim 8, wherein the control signal generator produces the control signal a selectable number of cycles of the system clock signal after receiving the trigger event signal.

10. A method of performing functional testing upon a microprocessor, comprising:

providing a model of the microprocessor, wherein the microprocessor model is coupled to receive a control signal, and wherein the microprocessor model is configured to produce a trigger event signal, to perform an activity of interest, and to respond to the control signal, and wherein the activity of interest occurs over a plurality of clock cycles;

providing a control signal generator, wherein the control signal generator is coupled to receive the trigger event signal and is configured to generate the control signal in response to the trigger event signal; and initiating execution of a testing program by the microprocessor model, wherein the testing program includes a program loop which causes the microprocessor model to produce the trigger event signal, to perform the activity of interest in order to produce a test result, and to compare the test result to an expected result, and wherein the program loop is repeatedly executed as long as the test result matches the expected result and until the microprocessor model responds to the control signal during each of the plurality of clock cycles of the activity of interest, and wherein successful completion of the testing program demonstrates proper operation of the microprocessor when responding to the control signal while performing the activity of interest.

11. The method as recited in claim 10, wherein the microprocessor model comprises a file consisting essentially of a list of operational elements, interconnection between the elements, and a plurality of instructions configured to exercise the elements.

12. The method as recited in claim 10, wherein the activity of interest comprises at least one activity of a plurality of activities which occur within the microprocessor.

13. The method as recited in claim 10, wherein the activity of interest is initiated by an instruction forwarded to the microprocessor model.

14. The method as recited in claim 10, wherein the control signal comprises an interrupt signal or a bus arbitration signal.

15. The method as recited in claim 10, wherein the trigger event signal is a predetermined combination of address, data, and control signals.

16. The method as recited in claim 10, wherein the occurrence of the trigger event signal indicates initiation of the activity of interest.

17. The method as recited in claim 10, wherein the control signal generator comprises a file consisting essentially of a list of operational elements, interconnection between the elements, and a plurality of instructions configured to exercise the elements.

18. The method as recited in claim 10, wherein a system clock signal is coupled to the microprocessor model and to the control signal generator.

19. The method as recited in claim 18, wherein the control signal generator is configured to generate the control signal a selectable number of clock cycles after receiving the trigger event signal.

20. A method of performing functional testing upon a microprocessor, comprising:

providing a model of the microprocessor, wherein the microprocessor model is coupled to receive a control signal, and wherein the microprocessor model is configured to produce a trigger event signal, to perform an activity of interest, and to respond to the control signal, and wherein the activity of interest occurs over a plurality of clock cycles;

providing a control signal generator, wherein the control signal generator is coupled to receive the trigger event signal and is configurable to generate the control signal a selectable delay time after-receiving the trigger event signal, and wherein the delay time is measured in clock cycles;

determining an initial value of the delay time such that the control signal generator will produce the control signal during the first of the plurality of clock cycles;

configuring the control signal generator to generate the control signal the delay time after receiving the trigger event signal;

producing the trigger event signal from the microprocessor model prior to initiating performance of the activity of interest in order to produce a test result;

comparing the test result to an expected result;

incrementing the delay time and repeating the configuring, producing, and comparing steps if the test result matches the expected result and until the microprocessor model responds to the control signal during each of the plurality of clock cycles of the activity of interest; and verifying proper operation of the microprocessor while performing the activity of interest if the test result matches the expected result during each execution of the comparing step.

21. The method as recited in claim 20, wherein the microprocessor model comprises a file consisting essentially of a list of operational elements, interconnection between the elements, and a plurality of instructions configured to exercise the elements.

22. The method as recited in claim 20, wherein the activity of interest comprises at least one activity of a plurality of activities which occur within the microprocessor.

23. The method as recited in claim 20, wherein the activity of interest is initiated by an instruction forwarded to the microprocessor model.

24. The method as recited in claim 20, wherein the control signal comprises an interrupt signal or a bus arbitration signal.

25. The method as recited in claim 20, wherein the trigger event signal is a predetermined combination of address, data, and control signals.

26. The method as recited in claim 20, wherein the determining step is accomplished by determining the number of system clock signal cycles between the trigger event signal and the first of the plurality of clock cycles of the activity of interest.

27. The method as recited in claim 26, wherein the trigger event signal occurs during the first of the plurality of clock cycles of the activity of interest, and the initial value of the delay time is therefore '0'.

28. The method as recited in claim 20, wherein the control signal generator comprises a file consisting essentially of a list of operational elements, interconnection between the elements, and a plurality of instructions configured to exercise the elements.

29. The method as recited in claim 20, wherein the control signal generator comprises an addressable control register, and wherein the control register comprises a delay time field, and wherein the delay time is stored within the delay time field of the control register.

30. The method as recited in claim 29, wherein the configuring step is accomplished by storing the delay time within the delay time filed of the control register, and wherein the storing operation is carried out before the trigger event signal is produced.

31. The method as recited in claim 20, wherein the system clock signal is coupled to the microprocessor model and to the control signal generator.

* * * * *